US009433998B2

(12) United States Patent
Furukawa et al.

(10) Patent No.: US 9,433,998 B2
(45) Date of Patent: Sep. 6, 2016

(54) SURFACE-TREATED MOLD AND METHOD OF PRODUCING SURFACE-TREATED MOLD

(71) Applicant: TOYOTA JIDOSHA KABUSHIKI KAISHA, Aichi-ken (JP)

(72) Inventors: Yuichi Furukawa, Toyota (JP); Jun Yaokawa, Nisshin (JP); Yasushi Iwata, Miyoshi (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 14/148,165

(22) Filed: Jan. 6, 2014

(65) Prior Publication Data

US 2014/0120250 A1 May 1, 2014

Related U.S. Application Data

(62) Division of application No. 12/945,085, filed on Nov. 12, 2010, now Pat. No. 8,657,252.

(30) Foreign Application Priority Data

Nov. 27, 2009 (JP) ................................ 2009-269826

(51) Int. Cl.
*B28B 7/38* (2006.01)
*C23C 16/26* (2006.01)
(Continued)

(52) U.S. Cl.
CPC . *B22C 3/00* (2013.01); *B05D 5/08* (2013.01); *B22C 9/061* (2013.01); *B22D 17/2209* (2013.01); *C23C 8/02* (2013.01); *C23C 8/20* (2013.01); *C23C 18/165* (2013.01); *C23C 18/1689* (2013.01); *C23C 18/1696* (2013.01); *C23C 18/1698* (2013.01); *C23C 18/32* (2013.01); *C23C 28/00* (2013.01)

(58) Field of Classification Search
USPC ........... 427/304, 305, 437, 443.1, 85, 249.1, 427/249.7
See application file for complete search history.

(56) References Cited

U.S. PATENT DOCUMENTS

| | | | |
|---|---|---|---|
| 6,821,624 | B2 | 11/2004 | Utsumi et al. |
| 2006/0026996 | A1 | 2/2006 | Chen |

(Continued)

FOREIGN PATENT DOCUMENTS

| | | | |
|---|---|---|---|
| CN | 101010442 | A | 8/2007 |
| JP | 64-062468 | A | 3/1989 |

(Continued)

OTHER PUBLICATIONS

Japanese Office Action issued on Nov. 8, 2011 in Application No. JP 2009-269826.

(Continued)

*Primary Examiner* — Dah-Wei D Yuan
*Assistant Examiner* — Nga Leung V Law
(74) *Attorney, Agent, or Firm* — Sughrue Mion, PLLC

(57) ABSTRACT

A surface-treated mold that includes a mold, a metal layer that is provided on a surface of the mold and contains at least one metal selected from nickel, chromium, tungsten and brass, and a carbon film that is provided on a surface of the metal layer, wherein the metal layer contains carbon, and the carbon concentration in the metal layer is higher between the boundary with the carbon film and the center of the metal layer than that between the boundary with the mold and the center of the metal layer.

8 Claims, 6 Drawing Sheets

(51) Int. Cl.

| | |
|---|---|
| ***B22C 3/00*** | (2006.01) |
| ***B22C 9/06*** | (2006.01) |
| ***B22D 17/22*** | (2006.01) |
| ***C23C 8/02*** | (2006.01) |
| ***C23C 8/20*** | (2006.01) |
| ***C23C 18/16*** | (2006.01) |
| ***C23C 18/32*** | (2006.01) |
| ***C23C 28/00*** | (2006.01) |
| ***B05D 5/08*** | (2006.01) |

(56) References Cited

U.S. PATENT DOCUMENTS

| | | | | |
|---|---|---|---|---|
| 2007/0148462 | A1* | 6/2007 | Hsiao et al. | 428/408 |
| 2010/0304065 | A1* | 12/2010 | Tomantschger et al. | 428/35.8 |
| 2010/0304171 | A1* | 12/2010 | Tomantschger et al. | 428/548 |
| 2011/0223339 | A1* | 9/2011 | Furukawa et al. | 427/402 |

FOREIGN PATENT DOCUMENTS

| | | | | |
|---|---|---|---|---|
| JP | 5-186870 | A | | 7/1993 |
| JP | 2001-262343 | A | | 9/2001 |
| JP | 2003-088939 | A | | 3/2003 |
| JP | 2006-169609 | A | | 6/2006 |
| JP | 2007-91479 | A | | 4/2007 |
| JP | 2008-105082 | A | | 5/2008 |
| JP | 2008105082 | A | * | 5/2008 |
| JP | 2008-157913 | A | | 7/2008 |
| WO | WO 2010067786 | A1 | * | 6/2010 |

OTHER PUBLICATIONS

Chinese Office Action issued in copending Chinese Applicaiton No. CN201010565647.0 on Aug. 3, 2012.

* cited by examiner

| NUMBER OF SHOTS | 500 | 1000 | 5000 | 10000 |
|---|---|---|---|---|
| SAMPLE 1 | ○ | ○ | ○ | ○ |
| SAMPLE 2 | ○ | × | — | — |

SURFACE-TREATED MOLD AND METHOD OF PRODUCING SURFACE-TREATED MOLD

PRIORITY INFORMATION

This is a Divisional of U.S. Ser. No. 12/945,085 filed on Nov. 11, 2010, now pending, which claims priority to Japanese patent application JP 2009-269826, filed Nov. 27, 2009. The disclosure of each of the prior applications is considered part of and is incorporated herein by reference in its entirety.

BACKGROUND OF THE INVENTION

1. Field of Invention

The present invention relates to a surface-treated mold, and a method of producing the surface-treated mold. More particularly, the present invention is directed to a mold with surfaces covered by a carbon film.

2. Description of Related Art

A technique that uses a mold to produce products with the same shape and quality in a large quantity is known. Japanese Patent Application Publication No. 2008-105082 (JP-A-2008-105082) describes a technique by which a surface of a mold is covered with a carbon film so that the product after molding can be easily taken out of the mold. In this technique, a surface of a mold is covered with fibrous nanocarbons to improve the abrasion resistance, corrosion resistance, thermal conductivity, friction properties and mechanical strength of the surface. When this technique is applied to a casting mold, for example, sticking of a melt to the casting mold can be prevented so that the service life of the casting mold can be increased. In the technique that is disclosed in JP-A-2008-105082, fibrous nanocarbons are allowed to grow on a surface of a mold to enhance the adhesion between the carbon film and the mold surface. The anchor effect of the fibrous nanocarbons prevents the carbon film from separating from the mold surface.

For example, in the case of a casting mold, when the carbon film separates from the mold surface, it is necessary to form a carbon film on the mold surface again. To reduce the number of maintenance of the mold, it is necessary to enhance the adhesion between the carbon film and mold. In the technique described in JP-A-2008-105082, a nitride layer and/or a sulfurized layer are provided between the carbon film and mold surface to enhance the adhesion between the carbon film and mold. In the technique that described in JP-A-2008-105082, a sulfide gas such as hydrogen sulfide ($H_2S$) or carbon disulfide ($CS_2$) is used to provide a sulfurized layer. Because these sulfide gases are toxic, it is necessary to provide the production apparatus with sufficient safety measures when such a sulfide gas is used. Thus, a need exists for a technique by which the adhesion between a carbon film and a mold can be enhanced without using a sulfide gas.

SUMMARY OF THE INVENTION

The present invention provides a surface-treated mold in which the adhesion between a carbon film and a metal layer is enhanced, and a method of producing such a surface-treated mold.

A first aspect of the present invention relates to a surface-treated mold. The surface-treated mold has a mold, a metal layer, and a carbon film. The metal layer is provided on a surface of the mold, and contains at least one metal selected from nickel, chromium, tungsten and brass. The carbon film is provided on a surface of the metal layer. The metal layer contains carbon. The carbon concentration in the metal layer is higher between the boundary with the carbon film and the center of the metal layer than that between the boundary with the mold and the center of the metal layer. In the surface-treated mold, the carbon film is firmly bound to the mold. This is because the carbon film and the carbon in the metal layer are bound to each other when a large amount of carbon is contained in the range from the boundary between the carbon film and the metal layer to the center of the metal layer. In addition, in the surface-treated mold, infiltration of carbon into a surface of the surface-treated mold can be prevented.

A second aspect of the present invention relates to a method of producing a surface-treated mold. The production method includes the formation of a metal layer and the formation of a carbon film. In the formation of the metal layer, an amorphous metal layer that contains at least one metal selected from the group consisting of nickel, chromium, tungsten and brass is formed on a surface of a mold. In the formation of a carbon film, a carbon film is formed over the metal layer while the metal layer is heated at a temperature of 410° C. to 510° C.

According to the above production method, a carbon film grows on the surface of the metal layer in the carbon film formation step while carbon infiltrates into the metal layer. When heated to 410° C. to 510° C., the metal layer undergoes a transition from an amorphous state to a crystalline state. Because the metal layer is hardened by crystallization, the adhesion between the carbon film and the metal layer is improved. Thus, a surface-treated mold with a carbon film that is less likely to separate from the surface of the mold, can be produced without using a sulfide gas. When a carbon film is allowed to grow on a surface of a crystalline metal layer, carbon hardly infiltrates into the metal layer. Thus, the adhesion between the carbon film and the metal layer cannot be improved. In the production method that is disclosed herein, a carbon film is formed on a surface of the metal layer while the metal layer changes from an amorphous state to a crystalline state. Thus, carbon infiltrates into the metal layer and improves the adhesion between the carbon film and the metal layer. It is therefore possible to produce a surface-treated mold in which the adhesion between the carbon film and the mold is improved by a method that is safer than the conventional method.

According to the present invention, a surface-treated mold that has a carbon film that is less likely to separate from the mold can be produced without using a toxic material gas.

BRIEF DESCRIPTION OF THE DRAWINGS

The foregoing and further features and advantages of the invention will become apparent from the following description of embodiments with reference to the accompanying drawings, wherein like numerals are used to represent like elements and wherein.

DETAILED DESCRIPTION OF EMBODIMENTS

Figure 1:
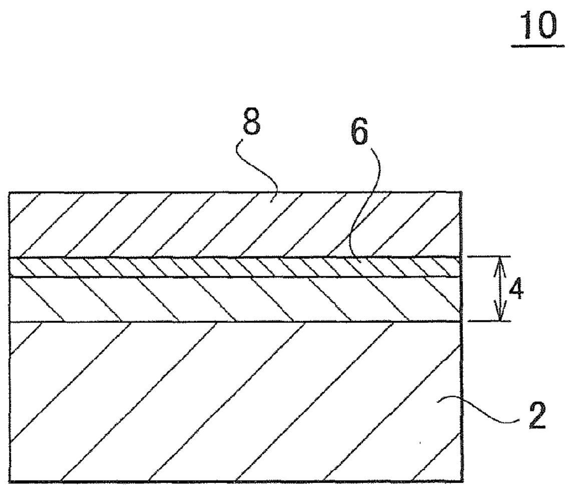
FIG. 1 is a cross-sectional view that illustrates the features of a surface-treated mold.

As shown in FIG. 1, a surface-treated mold that is disclosed herein includes a mold 2, a metal layer 4, and a carbon film 8. The metal layer 4 has a superficial layer in which carbon (C) 6 is diffused. An embodiment of the surface-treated mold 10 is described in detail below.

The surface-treated mold 10 may be used as, for example, a mold for casting a metal material, a press die and a mold for molding a resin. In particular, the surface-treated mold 10 may be used in casting aluminum. Because the carbon film 8 is formed, the molded product (aluminum product) can be easily released from the surface-treated mold 10. Also, the fluidity of aluminum melt can be ensured. In addition, sticking of aluminum melt to a surface of the surface-treated mold 10 can be prevented.

The mold 2 may be made of SKD61 (alloy tool steel: JIS G4404), which is a hot-die steel. The metal layer 4 is made of nickel, chromium, tungsten, brass, or a compound thereof. These metals can satisfactorily follow the deformation (such as thermal expansion or thermal contraction) of the mold 2. Also, these metals may be firmly bound to the carbon film 8. Preferably, the metal layer 4 is made of nickel, chromium or a compound thereof. Particularly preferably, the metal layer 4 is made of nickel.

The metal layer 4 preferably has a thickness of 2 μm to 10 μm. When the thickness is in this range, the metal layer 4 may satisfactorily follow the deformation of the mold 2 and, at the same time, the formation of both a carbon solid-solution diffusion layer and a layer that binds the metal layer 4 to the mold 2, which are described later, is ensured. Although details are described later, the metal layer 4 is amorphous immediately after it has been formed on a surface of the mold 2. The metal layer 4 undergoes a transition from an amorphous state to a crystalline state when the carbon film 8 is formed thereon.

The metal layer 4 may be formed on a surface of the mold 2 by a method such as thermal spraying, vapor deposition or plating. Particularly preferably, the metal layer 4 is formed on a surface of the mold 2 by electroless plating. An electroless plating layer is amorphous at a temperature of approximately 400° C. or lower and changes to a crystalline state when heated to approximately 400° C. or higher. Thus, when electroless plating is used, an amorphous metal layer 4 can be formed on a surface of the mold 2 without the use of a special device. That is, when the metal layer 4 is formed on a surface of the mold 2 by electroless plating, it is easy to maintain the metal layer 4 in an amorphous state. Also, electroless plating can easily form a metal layer with a uniform thickness as compared with other methods. Preferred examples of electroless plating include electroless nickel plating. An electroless nickel plating material often contains 5 to 15 wt % of phosphorus (P). Adjustment of the phosphorus content makes it possible to adjust the degree of hardness of the metal layer 4 after having been converted to the crystalline state. Also, the phosphorus has a function of activating the surface of the mold 2. When the metal layer 4 is formed by a method such as thermal spraying or vapor deposition, it is desirable that the carbon film 8 be formed on a surface of the metal layer 4 before the metal layer 4 is converted from an amorphous state to a crystalline state.

When electroless plating is used, a plating layer is deposited on a surface of the mold 2 by supplying an electroless plating material onto the mold 2. Examples of the method of supplying an electroless plating material include showering, spray, and immersion. Among them, immersion of the mold 2 into an electroless plating material (solution) is preferred from the perspective of obtaining a uniform plating thickness. The electroless plating solution is preferably adjusted to 80 to 90° C. Too low a solution temperature decreases the deposition rate of the plating film, so that it takes a longer time (a few hours or more) to form the plating layer 4, or it becomes difficult to form a plating layer 4 of a sufficient thickness. Too high a solution temperature causes local variations in deposition rate, so that it becomes difficult to obtain a uniform plating layer 4. When the solution temperature is in the above range, a plating layer 4 with a uniform thickness can be obtained in a short period of time (several minutes).

A carbon solid-solution diffusion layer 6 is formed in a superficial region of the metal layer 4. The solid-solution diffusion layer 6 is a part of the metal layer 4. The solid-solution diffusion layer 6 is formed as a result of infiltration of carbon into a surface of the metal layer 4 when the carbon film 8 is formed on the surface of the metal layer 4. Thus, the solid-solution diffusion layer 6 may be regarded as that portion of the carbon film 8 that is infiltrated into the metal layer 4. Also, the solid-solution diffusion layer 6 may be referred to as a mixed phase of the elements that form the metal layer 4 and the elements that form the carbon film 8. The carbon film 8 is firmly bound to the metal layer 4 by the solid-solution diffusion layer 6. The solid-solution diffusion layer 6 preferably has a thickness of 0.5 μm to 2.0 μm. When the thickness is in this range, the carbon film 8 and the metal layer 4 can be firmly bound to each other.

As described above, the solid-solution diffusion layer 6 is formed as a result of infiltration of carbon into a surface of the metal layer 4. Thus, when the carbon content in a cross-section of the metal layer 4 is measured, the carbon content in the range from the boundary between the carbon film 8 and the metal layer 4 to the center of the metal layer 4 is higher than that in the range from the boundary between the mold 2 and the metal layer 4 to the center of the metal layer 4. That is, the carbon content is low in that region of the metal layer 4 that is adjacent to the mold 2. This prevents infiltration of carbon into the mold 2. In order to form the solid-solution diffusion layer 6, it is preferred that an amorphous metal layer 4 be first formed on a surface of the mold 2 (metal layer formation step) and that the metal layer 4 be crystallized while the carbon film 8 is formed thereon (carbon film formation step).

The carbon film 8 is preferably fibrous. When the carbon film 8 is fibrous, end portions of the fibrous carbon film 4 are bound to carbon in the solid-solution diffusion layer 6 so that the carbon film 4 becomes contiguous to the carbon in the solid-solution diffusion layer 6. In other words, a part of the fibrous carbon film 8 is buried in the solid-solution diffusion layer 6. As a result, the adhesion between the carbon film 8 and the metal layer 4 is enhanced. Examples of the material that forms the fibrous carbon film 8 include carbon nanocoils, carbon nanotubes, carbon nanofilaments, and mixtures thereof.

As a raw material of the fibrous carbon film 8, a hydrocarbon such as acetylene or ethylene may be used. The mold 2 on which the metal layer 4 has been formed is placed in an atmosphere furnace. Then, while an acetylene gas, for example, is passed through the atmosphere furnace, the temperature in the atmosphere furnace is increased from 410° C. to 510° C., whereupon a fibrous carbon film 8 is formed on the surface of the metal layer 4. When only a hydrocarbon gas is passed through the atmosphere furnace, a large amount of soot adheres to the inside of the atmosphere furnace. Thus, it is preferred to feed a gaseous mixture of a hydrocarbon gas and a diluent gas through the atmosphere furnace. One example of the diluent gas is ammonia gas. When a mixture of acetylene gas and ammonia gas is used, it is preferred to stop the supply of the acetylene gas when a prescribed period of time has elapsed after a prescribed temperature (410° C. to 510° C.) has been reached and to supply only ammonia gas after that. By this expedience, ionization of acetylene proceeds and a fibrous carbon film 8 grows while the acetylene gas is diluted. After the carbon film 8 has grown, it is also preferred to stop the supply of ammonia gas and to reduce the temperature in the atmosphere furnace to below 150° C. while feeding an inert gas, such as nitrogen ($N_2$), through the atmosphere furnace. This prevents oxidation of the carbon film 8.

As described above, the surface-treated mold 10 can be used as a mold for casting an aluminum product. A plating layer is not usually formed on a surface of a mold for casting an aluminum product. In particular, a nickel plating layer is not formed on a surface of such a mold. Nickel is used as a binder between aluminum and iron (materials of molds). Thus, when a nickel plating layer is formed on a surface of the mold, aluminum melt is firmly bound to the surface of the mold. Then, the aluminum product cannot be released from the mold easily. In the case of the surface-treated mold 10, on the other hand, because the carbon film 8 is formed on the surface of the metal layer 4, the aluminum product can be easily released from the surface-treated mold 10 even if a nickel plating layer (metal layer) 4 is formed on a surface of the mold 2. When casting of an aluminum product is repeated, the carbon film 8 on the metal layer 4 decreases. Even when the amount of the carbon film 8 has decreased, the tendency of aluminum to adhere to the surface of the surface-treated mold 10 does not increase as compared with a surface-treated mold without a plating layer on its surface. The mechanism of this is not fully understood, however.

A surface-treated mold 10 as shown in FIG. 1 was produced. First, a surface of the mold 2 was subjected to ultrasonic cleaning using a solution that contained sodium silicate and a surfactant, and then an oxide film on the surface was removed with 5% hydrochloric acid (HCl) aqueous solution. Then, immediately after water washing, a metal layer formation step was carried out. By the ultrasonic cleaning, the surface of the mold 2 can be degreased. In the metal layer formation step, the mold 2 was immersed into an electroless plating solution at approximately 90° C. The electroless plating solution that was used was Top Nicoron BL (manufactured by OKUNO CHEMICAL INDUSTRIES CO., LTD.; phosphorus content: approximately 7% by weight). The mold 2 was immersed for approximately 20 minutes. As a result, a plating layer 4 with a thickness of approximately 8.5 μm was formed on the surface of the mold 2. Then, the plating layer 4 was dried with a dryer.

Figure 2:
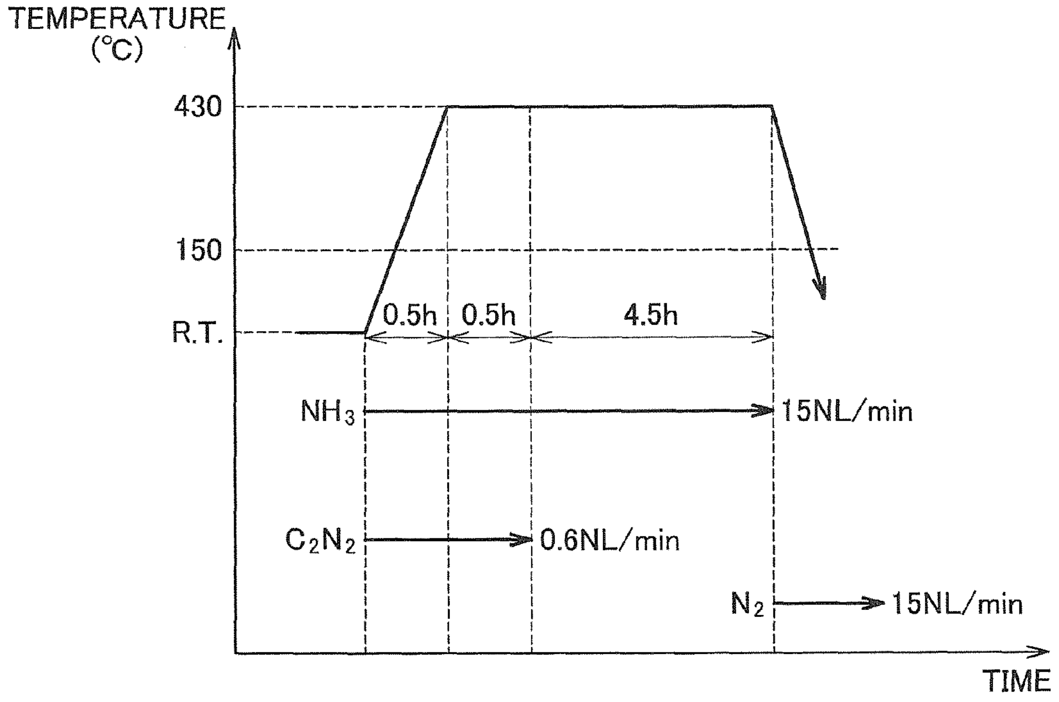
FIG. 2 shows the treatment profile of a carbon film formation step.

A carbon film formation step was next carried out. The carbon film formation step was carried out in an atmosphere furnace. First, the mold 2 was placed in the atmosphere furnace, and the air in the atmosphere furnace was purged. Next, a carbon film 8 was formed according to the treatment profile that is shown in FIG. 2. The treatment profile is described below. First, while an acetylene ($C_2H_2$) gas and an ammonia ($NH_3$) gas were passed through the atmosphere furnace, the temperature in the atmosphere furnace was increased to 430° C. over 0.5 h. The flow rate of the acetylene gas was 0.6 NL/min, and the flow rate of the ammonia gas was 15 NL/min (first step). That is, a mixed gas that had a ratio in flow rate of the acetylene gas to the ammonia gas of 1:25 was passed through the atmosphere furnace. The supply of acetylene gas was stopped when 0.5 h was elapsed after the temperature in the atmosphere furnace had reached 430° C. Then, only an ammonia gas was passed through the atmosphere furnace for 4.5 h while maintaining the temperature in the atmosphere furnace at 430° C. (second step). After that, the supply of ammonia gas was stopped and the temperature in the atmosphere furnace was decreased to 150° C. or lower, while a nitrogen gas was passed through the atmosphere furnace at 15 NL/min. An SEM photograph of the resulting surface-treated mold 10 is shown in FIG. 3.

Figure 3:
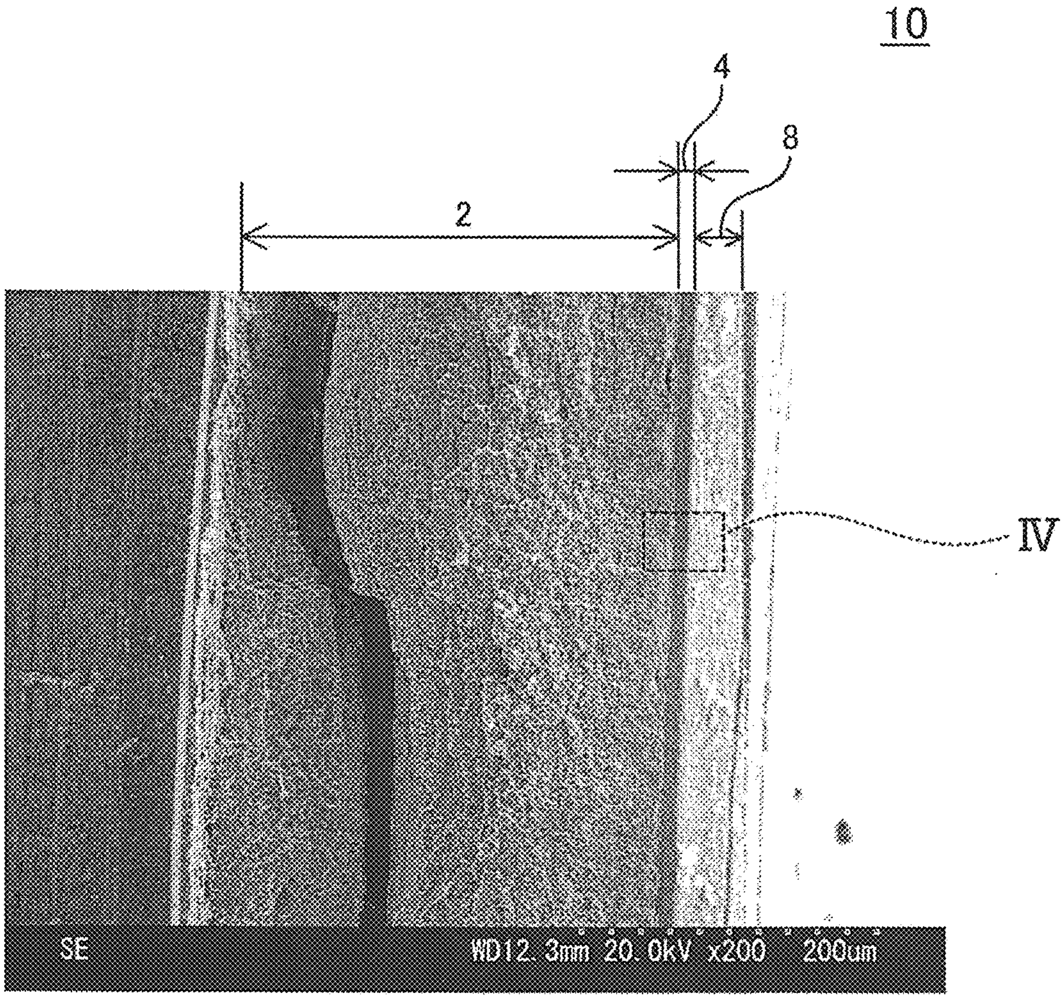
FIG. 3 shows an SEM photograph of a cross-section of a surface-treated mold of Example 1.
Figure 4:
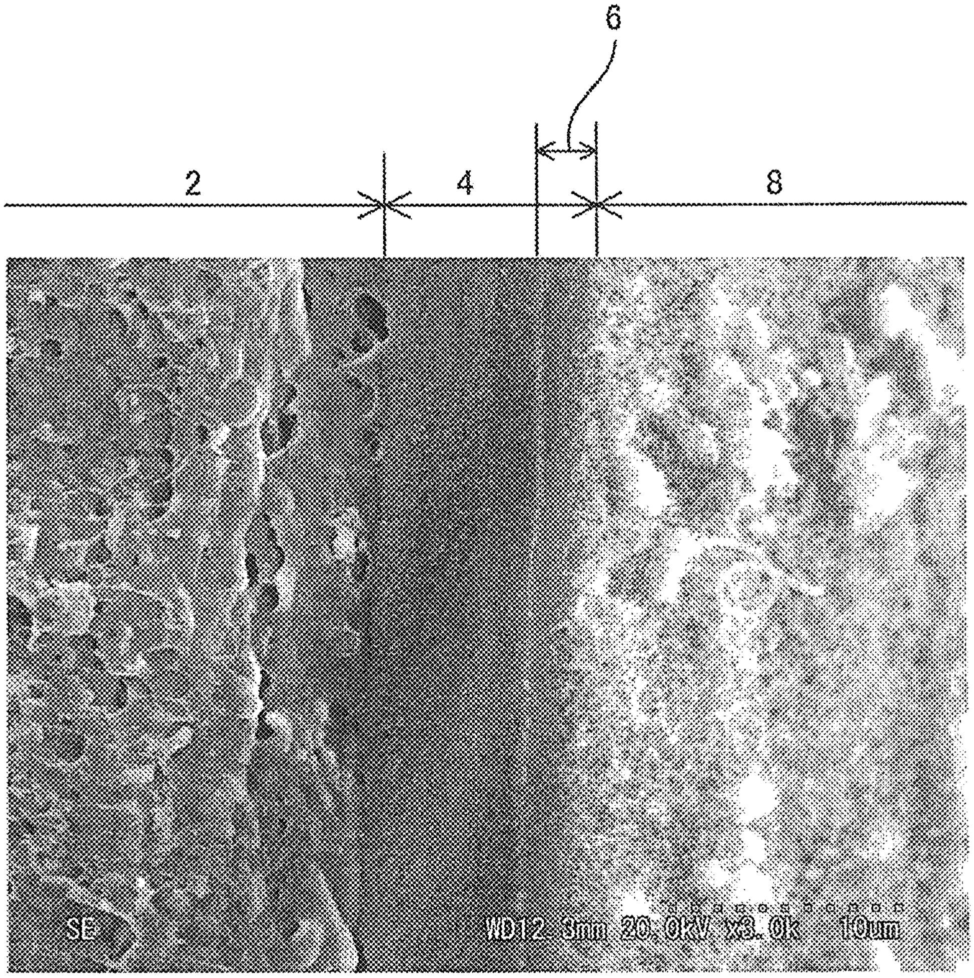
FIG. 4 is an enlarged SEM photograph of the area that is surrounded by broken line IV in FIG. 3.

As shown in FIG. 3, in the surface-treated mold 10, a nickel plating layer 4 was formed on the surface of the mold 2, and a carbon film 8 was formed on the surface of the nickel plating layer 4. FIG. 4 shows an enlarged view of the area that is surrounded by broken line IV in FIG. 3. As shown in FIG. 4, a carbon solid-solution diffusion layer 6 was observed in a superficial region (in a region on the side of the carbon film 8) of the nickel plating layer 4. The solid-solution diffusion layer 6 had a thickness of approximately 1.0 to 2.0 μm.

Figure 5:
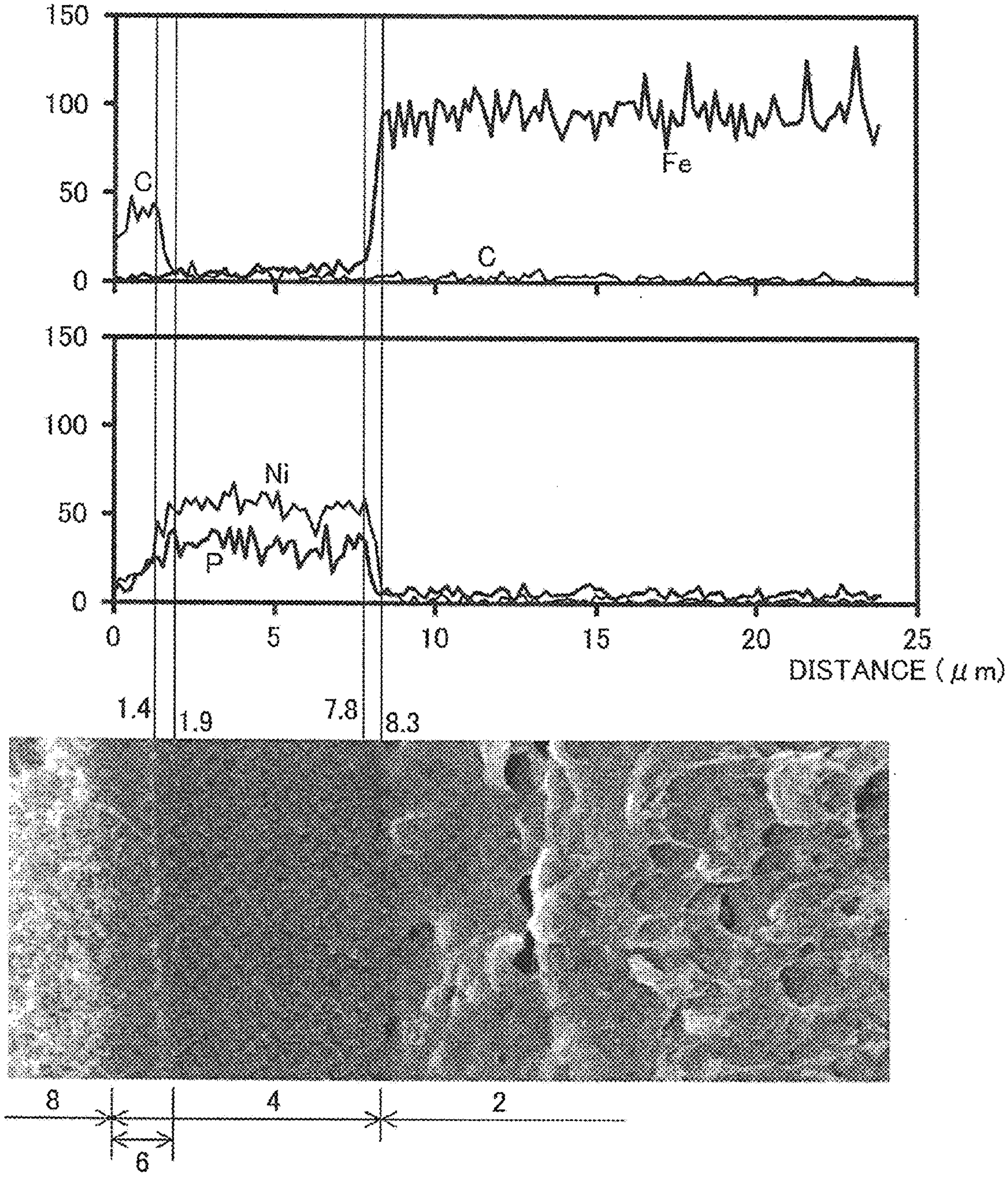
FIG. 5 shows the result of EPMA analysis of the surface-treated mold of Example 1.

FIG. 5 shows the result of EDX (Energy Dispersive X-ray Fluorescence Spectrometer) analysis of a cross-section of the surface-treated mold 10. The vertical axis of the graph represents the intensity (number of counts) of the detected element, and the horizontal axis represents the distance from the surface of the nickel plating layer 4. As is clear from FIG. 5, the solid-solution diffusion layer 6 in which carbon, nickel and phosphorus coexisted was observed in the range of approximately 1.9 μm from the surface of the nickel plating layer 4. Carbon is a component of the carbon film 8, and nickel and phosphorus are components of the nickel plating layer 4. In the range of 1.4 μm from the front surface (0 μm), the carbon content was almost uniform. In the range from 1.4 μm to 1.9 μm, the carbon content decreased in the direction toward the rear surface. The nickel content and phosphorus content increased from the surface toward the depth of 1.9 μm. It should be noted that the nickel and phosphorus that were detected in the range of 1.4 μm from the surface as shown in FIG. 5 might be due to errors in measurement because the carbon content was almost uniform in the range of 1.4 μm from the surface. That is, the region from the surface to the depth of 1.4 μm in FIG. 5 can be regarded as a part of the carbon film 8. In this case, the solid-solution diffusion layer 6 has a thickness of approximately 0.5 μm. In the surface-treated mold 10 of this example, at least approximately 0.5 μm of a thickness of the solid-solution diffusion layer 6 can be secured.

Figure 6:
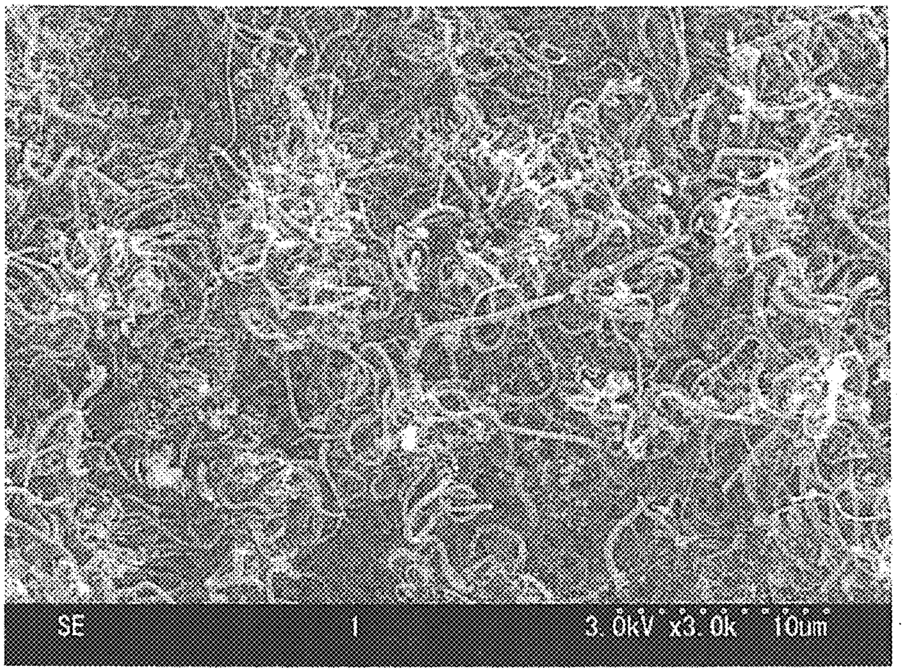
FIG. 6 shows an SEM photograph of a surface of the surface-treated mold of Example 1.

As is clear from FIG. 5, nickel, phosphorus and iron (Fe) coexisted in the range of 7.8 to 8.3 μm from the surface. The nickel and phosphorus are components of the nickel plating layer 4. The iron is a component of the mold 2. That is, the presence of a layer that binds the nickel plating layer 4 to the mold 2 was observed. The layer that binds the nickel plating layer 4 to the mold 2 had a thickness of approximately 0.5 μm. As shown in FIG. 6, the formation of a fibrous carbon film 8 on the surface of the surface-treated mold 10 was observed. When the nickel plating layer 4 has a thickness of about 2 μm, the layer that binds the nickel plating layer 4 to the mold 2 and the solid-solution diffusion layer 6 are both ensured.

As the material of the metal layer 4, the following materials were tested. Each of the metal layers that were composed of (1) chromium (Cr) plating, (2) tungsten (W), (3) brass (alloy of copper (Cu) and zinc (Zn)), (4) molybdenum (Mo) and (5) electroless nickel plating that was crystallized prior to the carbon film formation step, was formed on a mold, and the same carbon film formation step as that in Example 1 was carried out on each mold. In the case of the metal layer (5), however, the same carbon film formation step as in Example 1 was carried out after the metal layer 4 had been heated to 430° C. and crystallized.

Figure 7:
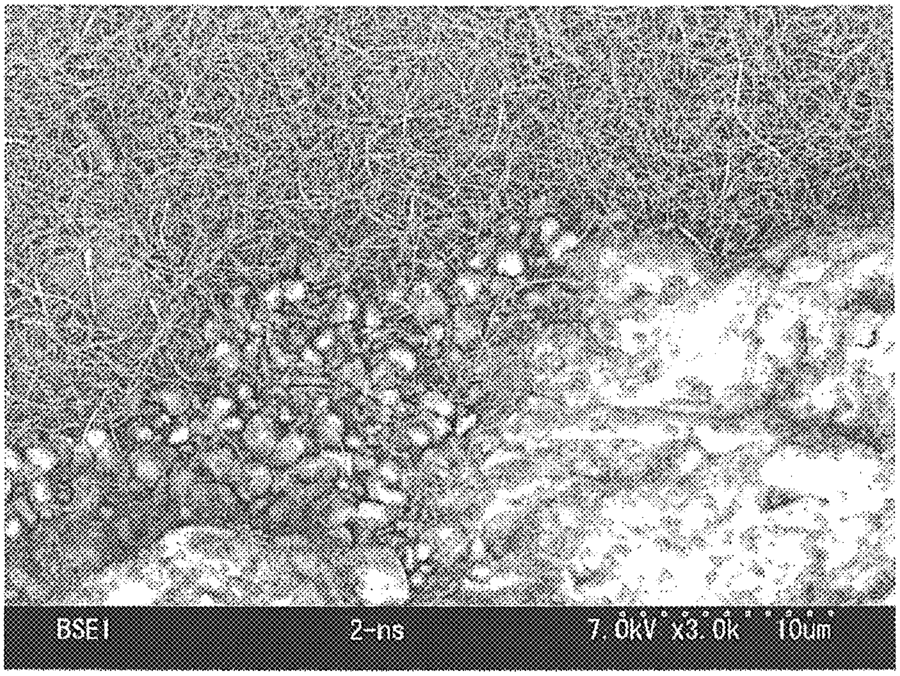
FIG. 7 shows an SEM photograph of a surface of a surface-treated mold of Example 2.
Figures 8, 9:
FIG. 8 shows an SEM photograph of a surface of a surface-treated mold of Example 2.
FIG. 9 shows the result of appearance observation of Sample 1 and Sample 2 that was made once every prescribed number of shots.

FIG. 7 shows an SEM photograph of a surface of the mold with the metal layer (1) after the carbon film formation step. FIG. 8 shows an SEM photograph of a surface of the mold with the metal layer (4) after the carbon film formation step. As shown in FIG. 7, it was confirmed that when chromium plating was used to form the metal layer, a fibrous carbon film was formed though the metal layer was partially exposed. Although not shown, the same result as in the case of the metal layer (1) was obtained in the cases of the metal layers (2) and (3). On the contrary, it was observed that no carbon film was formed when molybdenum was used for the metal layer as shown in FIG. 8. The same was true for the case of the metal layer (5). That is, it was found that when nickel plating is used to form the metal layer, even if a nickel plating layer is formed on a surface of the mold, a carbon film does not grow on the surface of the nickel plating layer unless the nickel plating layer is amorphous. When the carbon film formation step is carried out while the nickel plating layer is in an amorphous state, a solid-solution diffusion layer is formed in the metal layer and a carbon film is formed on the surface of the metal layer.

A surface-treated mold of Example 1 (Sample 1) and a surface-treated mold of Comparative Example (Sample 2) were produced, and casting of an aluminum product was repeatedly carried out. The surface-treated mold of Comparative Example was produced according to the method that is disclosed in JP-A-2008-105082. That is, acetylene gas, an ammonia gas and a hydrogen sulfide gas were used as raw material gases to produce the surface-treated mold of Comparative Example. Thus, the surface-treated mold of Comparative Example had a nitride layer and a sulfurized layer between the carbon film and the mold. In the method of Comparative Example, acetylene gas, an ammonia gas and a hydrogen sulfide gas were directly supplied to the mold. Because a surface of a mold is usually inert by the effect of oxides and so on, the use of a hydrogen sulfide gas is inevitable to activate the surface of the mold. A fibrous carbon film is less likely to grow on the surface of the mold when hydrogen sulfide gas is not used. Also, because a nitride layer is formed on the molding surface of the mold, the toughness of the molding surface decreases. Thus, the molding surface cannot follow a change in volume of the mold and the nitride layer tends to develop "cracks." Because casting conditions for aluminum products are well known, their detailed description is omitted. The appearance of Sample 1 and Sample 2 was observed once every prescribed number of shots. The results are summarized in FIG. 9.

The mark "o" in FIG. 9 indicates that the appearance of the mold was good, whereas the mark "x" indicates that something abnormal was observed in the appearance. When the appearance is good, the mold does not need maintenance (another surface treatment). When the appearance is not good, the mold needs maintenance. As shown in FIG. 9, the surface-treated mold of Example 1 had good appearance even after 10000 shots. On the contrary, cracks were observed in the surfaces of the surface-treated mold of Comparative Example after 1000 shots. Specifically, the surface-treated mold of Comparative Example had cracks in the nitride layer. The surface-treated mold of Example 1 needs less frequent maintenance than the surface-treated mold of Comparative Example.

As described above, according to the technique that is disclosed herein, it was confirmed that a fibrous carbon film grows on a surface of a mold even when a sulfide gas is not used. Also confirmed is that, because a carbon solid-solution diffusion layer is formed on the surface of the metal layer, the carbon film can be firmly bound to the surface of the metal layer.

The surface-treated mold and the method for the production of the surface-treated mold according to an embodiment (Example) of the present invention are summarized below.

The surface-treated mold according to an embodiment of the present invention has a metal layer that is composed of a particular element between the carbon film and the mold to enhance the adhesion therebetween. The surface-treated mold is characterized in that the metal layer contains more carbon in the superficial region (the range from the boundary between the carbon film and the metal layer to the center of the metal layer) than in the deep region (the range from the boundary between the mold and the metal layer to the center of the metal layer). When the metal layer contains more carbon in the superficial range, the carbon film and the carbon in the metal layer are bound to each other. Thus, the adhesion between the carbon film and the metal layer is enhanced. As a result, the adhesion between the carbon film and the mold can be improved without using a sulfide gas.

The surface-treated mold according to the present invention includes a mold, a metal layer, and a carbon film. The metal layer is provided on a surface of the mold, and contains at least one that is selected from nickel, chromium, tungsten and brass. The carbon film is provided on a surface of the metal layer. The metal layer contains carbon. The carbon content in the metal layer is higher in the range from the boundary between the carbon film and the metal layer to the center of metal layer than in the range from the boundary between the mold and the metal layer to the center of the metal layer.

The carbon film may be formed of at least one of carbon nanocoils, carbon nanotubes and carbon nanofilaments. The carbon film is fibrous and end portions of the fibers are bound to carbon in the metal layer. The carbon film satisfactory follows the change in volume of the mold. Thus, the carbon film is less likely to separate from the mold.

The metal layer may be a "plating layer." A uniform metal layer can be provided on a surface of the mold. Particularly preferred is a nickel plating layer.

The metal layer may have a thickness of 2 μm or greater and 10 μm or less. When the metal layer has a thickness of less than 2 μm, a sufficient thickness of the metal layer that contains carbon (for example, plating layer) cannot be secured. Thus, the carbon film and the metal layer are not firmly bound to each other. Also, the formation of a layer that binds the metal layer to the mold cannot be ensured. When the metal layer has a thickness over 10 μm, the metal layer cannot follow the expansion or contraction of the mold when the mold is expanded or contracted. The metal layer may be broken by expansion or contraction of the mold. When the metal layer has a thickness of 2 μm or greater and 10 μm or less, the adhesion between the carbon film and the metal layer can be maintained at a high level and the metal layer can be prevented from being broken.

The method of producing a surface-treated mold according to the present invention includes the formation of a metal layer and the formation of a carbon film. In the formation of the metal layer, an amorphous metal layer that contains at least one metal selected from the group consisting of nickel, chromium, tungsten and brass is formed on a surface of a mold. In the formation of a carbon film, a carbon film is formed over the metal layer as the metal layer is heated at 410° C. to 510° C.

In the formation of the metal layer, the metal layer may formed by electroless nickel plating. An electroless nickel plating layer continues to be amorphous on the mold surface unless it is subjected to a heat treatment at a high temperature. This makes it easy to store the mold until the start of the formation of the carbon film after the formation of the metal layer.

In the formation of the carbon film, a gaseous mixture of a hydrocarbon gas and a diluent gas may be supplied for at least a certain period of time.

In the formation of the carbon film, a gaseous mixture of acetylene gas and ammonia may be supplied for at least a certain period of time. A fibrous carbon film can be thereby formed on a surface of the metal layer. It should be noted that when only acetylene gas is supplied during the formation of the carbon film, a large amount of soot adheres to the inside of the apparatus. Also, control of the thickness of the carbon film is difficult. When the above gaseous mixture is used, it is possible to prevent adhesion of an excess amount of soot to the inside of the apparatus and to form a carbon film with a desired thickness. The ammonia is not directly involved in the formation of the carbon film. The ammonia functions as a diluent gas for the acetylene gas.

When a gaseous mixture of acetylene gas and ammonia is used in the formation of the carbon film, only ammonia may be supplied after the supply of the gaseous mixture. This makes it possible to form a fibrous carbon film while controlling the thickness of the carbon film.

While the invention has been described with reference to example embodiments thereof, it is to be understood that the invention is not limited to the described embodiments or constructions. The invention is intended to cover various modifications and equivalent arrangements. In addition, while the various elements of the disclosed invention are shown in various example combinations and configurations, other combinations and configurations, including more, less or only a single element, are also within the scope of the appended claims.

What is claimed is:

1. A method of producing a surface-treated mold, comprising:

forming an amorphous metal layer that contains at least one metal selected from the group consisting of nickel, chromium, tungsten and brass on a surface of a mold; and forming a carbon film over the amorphous metal layer while heating the amorphous metal layer at a temperature of 410° C. to 510° C., wherein the mold is made of tool steel or iron.

2. The method according to claim 1, wherein the amorphous metal layer is formed by electroless nickel plating.

3. The method according to claim 1, wherein a gaseous mixture of a hydrocarbon gas and a diluent gas is supplied for at least a part of the time period during which the carbon film is formed on the surface of the amorphous metal layer.

4. The method according to claim 1, wherein a gaseous mixture of acetylene and ammonia is supplied for at least a part of the time period during which the carbon film is formed on the surface of the amorphous metal layer.

5. The method according to claim 4, wherein the carbon film on the surface of the amorphous metal layer is formed by supplying a gaseous mixture of acetylene and ammonia and subsequently supplying only ammonia.

6. The method according to claim 1, wherein a carbon solid-solution diffusion layer is formed between the amorphous metal layer and the carbon film.

7. The method according to claim 1, wherein the carbon film is fibrous.

8. The method according to claim 1, wherein the carbon film is formed of at least one of carbon nanocoils, carbon nanotubes and carbon nanofilaments.

* * * * *